United States Patent
Hori

(10) Patent No.: US 12,438,108 B2
(45) Date of Patent: Oct. 7, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Yoichi Hori, Himeji Hyogo (JP)

(73) Assignees: Kabushiki Kaisha Toshiba; Toshiba Electronic Devices & Storage Corporation

( * ) Notice: Subject to any disclaimer, the term of this patent is extended or adjusted under 35 U.S.C. 154(b) by 419 days.

(21) Appl. No.: 18/177,078

(22) Filed: Mar. 1, 2023

(65) Prior Publication Data

US 2024/0088073 A1 Mar. 14, 2024

(30) Foreign Application Priority Data

Sep. 14, 2022 (JP) ................. 2022-146349

(51) Int. Cl.
| | |
|---|---|
| H01L 23/00 | (2006.01) |
| H01L 23/31 | (2006.01) |
| H10D 8/60 | (2025.01) |
| H10D 64/23 | (2025.01) |
| H01L 23/29 | (2006.01) |

(52) U.S. Cl.
CPC .......... *H01L 24/05* (2013.01); *H01L 23/3135* (2013.01); *H10D 8/60* (2025.01); *H10D 64/23* (2025.01); *H01L 23/296* (2013.01); *H01L 2224/05553* (2013.01); *H01L 2224/05556* (2013.01); *H01L 2224/05567* (2013.01); *H01L 2224/05624* (2013.01); *H01L 2224/05647* (2013.01); *H01L 2924/12032* (2013.01); *H01L 2924/186* (2013.01)

(58) Field of Classification Search
CPC ... H01L 24/05; H01L 23/3135; H01L 23/296; H01L 2224/05553; H01L 2224/05556; H01L 2224/05567; H01L 2224/05624; H01L 2224/05647; H01L 2924/12032; H01L 2924/186; H10D 8/60; H10D 64/23
See application file for complete search history.

(56) References Cited

U.S. PATENT DOCUMENTS

2018/0240914 A1 8/2018 Nagaoka

FOREIGN PATENT DOCUMENTS

| JP | H01207931 A | 8/1989 |
|---|---|---|
| JP | H02030130 A | 1/1990 |
| JP | 2013239607 A | 11/2013 |
| JP | 2015222784 A | 12/2015 |
| JP | 6558385 B2 | 8/2019 |

*Primary Examiner* — Samuel A Gebremariam
(74) *Attorney, Agent, or Firm* — Kim & Stewart LLP

(57) ABSTRACT

According to one embodiment, a semiconductor device includes a first electrode and a semiconductor layer above the first electrode in a first direction. The semiconductor layer has a first region and a second region surrounding the first region in a first plane perpendicular to the first direction. A second electrode has a first portion and a second portion that is thinner than the first portion and surrounds the first portion. The first portion and the second portion are on the first region of the semiconductor layer. A first resin is on the second region and covers the second portion and an outer periphery of the first portion of the second electrode. A second resin covers the second electrode and the first resin and is a resin material different from the first resin.

19 Claims, 10 Drawing Sheets

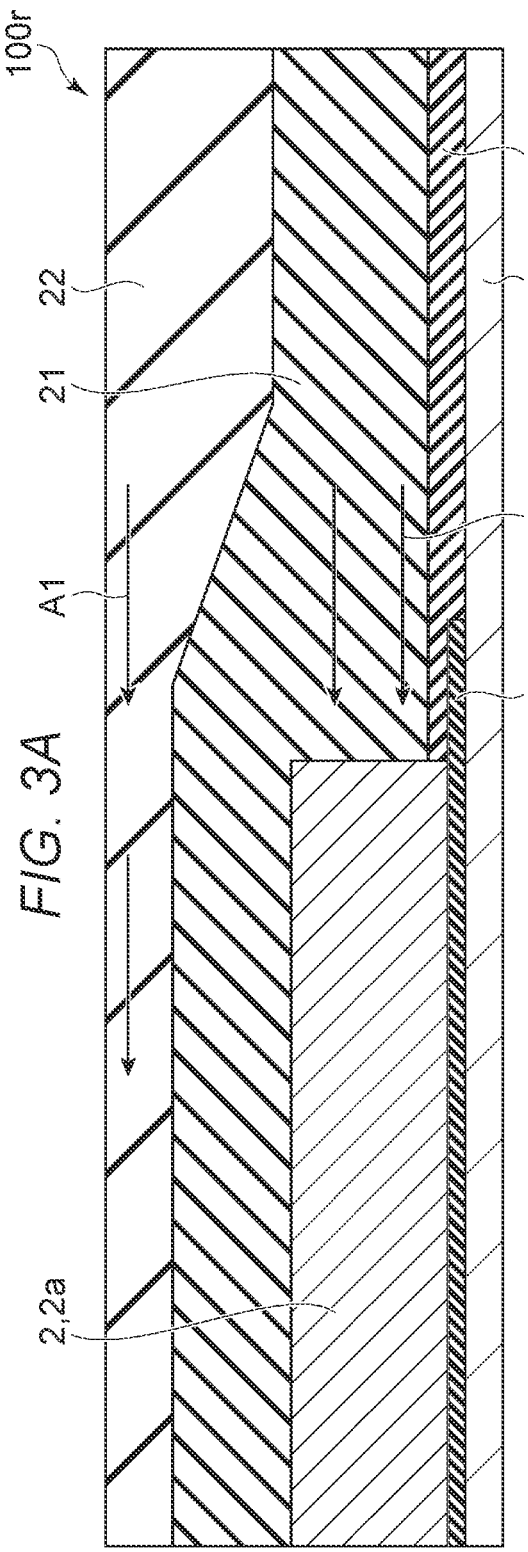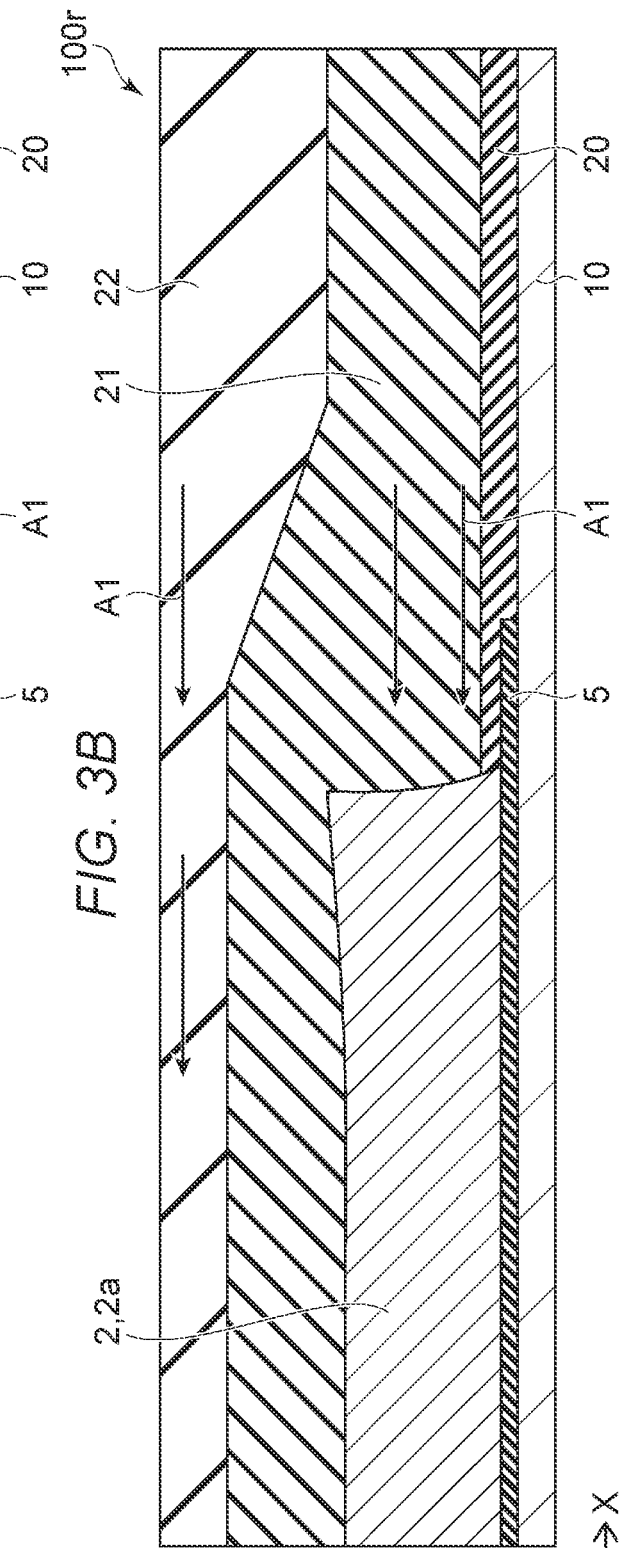

SEMICONDUCTOR DEVICE

CROSS-REFERENCE TO RELATED APPLICATION(S)

This application is based upon and claims the benefit of priority from Japanese Patent Application No. 2022-146349, filed Sep. 14, 2022, the entire contents of which are incorporated herein by reference.

FIELD

Embodiments described herein relate generally to a semiconductor device.

BACKGROUND

A semiconductor device, such as a metal oxide semiconductor field effect Transistor (MOSFET), can be used in such applications as power conversion. Improved reliability in such devices would be desirable.

BRIEF DESCRIPTION OF THE DRAWINGS

FIGS. 3A and 3B are cross-sectional views illustrating a part of a semiconductor device of a reference example.

DETAILED DESCRIPTION

In general, according to one embodiment, a semiconductor device includes a first electrode and a semiconductor layer above the first electrode in a first direction. The semiconductor layer has a first region and a second region surrounding the first region in a first plane perpendicular to the first direction. A second electrode has a first portion and a second portion that is thinner than the first portion in the first direction and surrounds the first portion in a plane parallel to the first plane. The first portion and the second portion of the second electrode are above the first region of the semiconductor layer in the first direction. An insulating first resin is on the second region and covers an outer periphery of the first portion and the second portion. An insulating second resin is on the second electrode and the insulating first resin. The insulating second resin comprises a resin material different from the insulating first resin.

Certain example embodiments of the disclosure will be described with reference to the drawings.

In general, the drawings are schematic or conceptual, and the depicted relationships between dimensions such as the thickness and the width of each element or component, relative proportions of dimensions of the elements or component, and the like are not necessarily identical to those of an actual device or the like. Even the same elements may be represented differently in dimensions or proportions depending on the drawings.

In the description, elements the same or substantially similar to those already described are denoted by the same reference symbols, and detailed descriptions thereof may be omitted as appropriate from subsequent description.

In the following, notations such as $n^+$, n, $n^-$ (or similarly $p^+$, p, $p^-$) represent impurity (dopant) concentration levels from a relatively high concentration level to a relatively low concentration level. That is, the notation with "+" indicates a relatively higher impurity concentration than the notation without "+" and the notation with "−" indicates a relatively lower impurity concentration than the notation without "−." When both a p-type impurity and an n-type impurity are contained in the same region, these notations represent net impurity concentrations after these impurities of different types compensate (offset) for each other.

Embodiments described below may, in general, also be implemented out by inverting p and n types of the described semiconductor regions.

Figure 1:
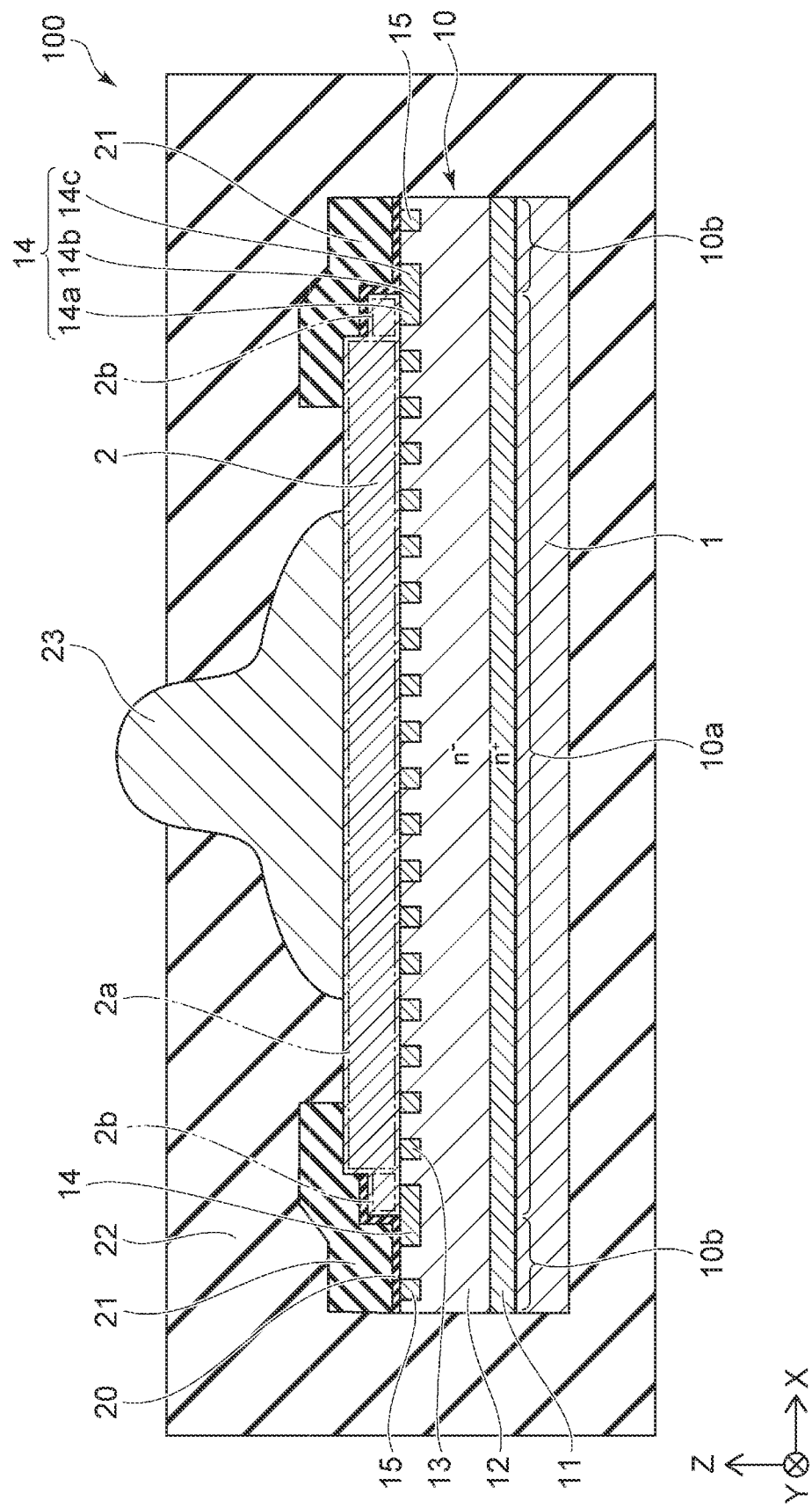
FIG. 1 is a cross-sectional view illustrating a semiconductor device according to a first embodiment.
Figure 2:
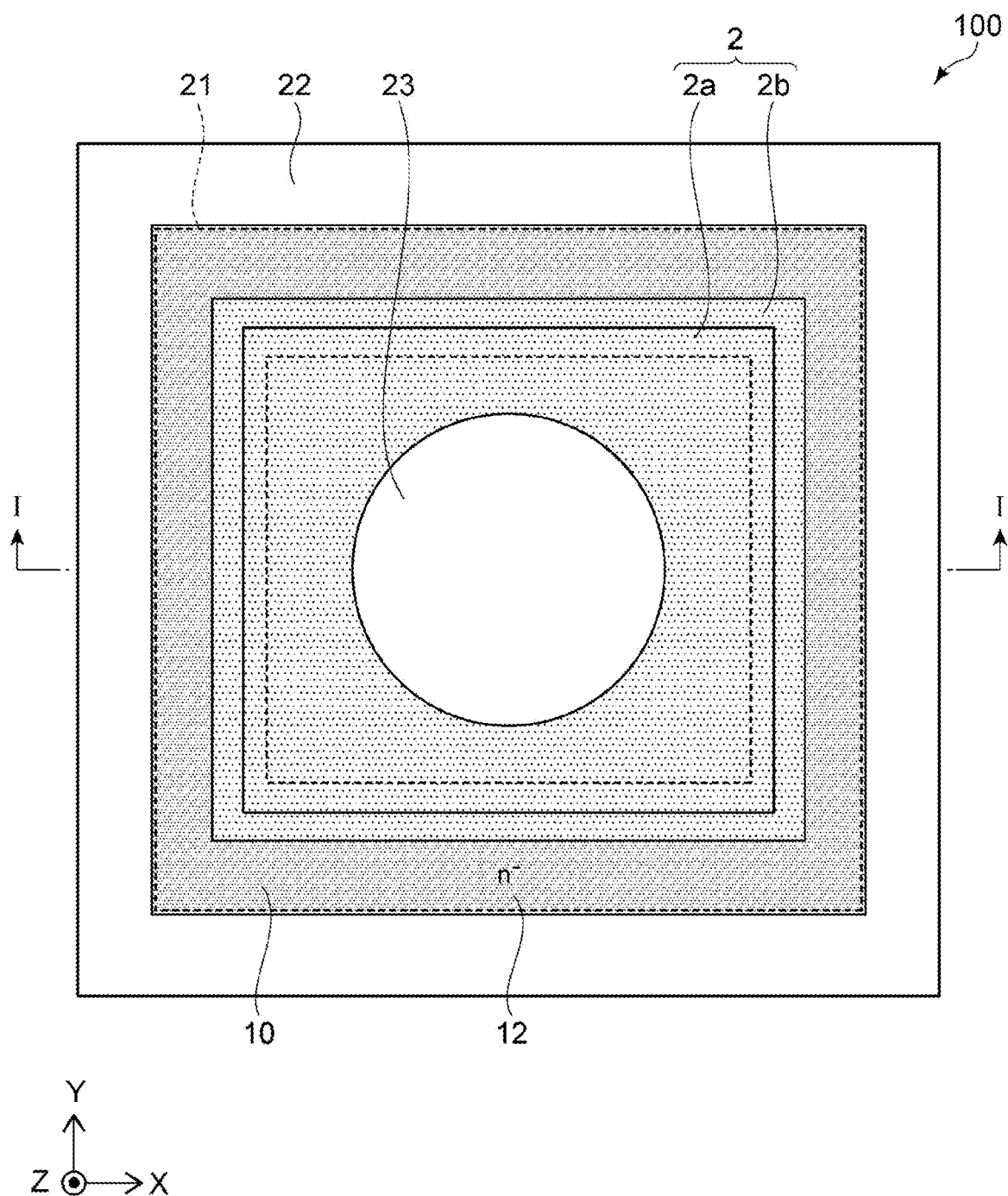
FIG. 2 is a plan view illustrating a semiconductor device according to a first embodiment.

FIG. 1 is a cross-sectional view illustrating a semiconductor device according to a first embodiment. FIG. 2 is a plan view illustrating the semiconductor device according to the first embodiment. FIG. 1 is a cross-sectional view taken along I-I of FIG. 2.

As illustrated in FIGS. 1 and 2, a semiconductor device 100 according to the first embodiment includes a lower electrode 1 (first electrode), an upper electrode 2 (second electrode), a metal layer 5, a semiconductor layer 10, an insulating layer 20, a first resin 21, a second resin 22, and an interconnection 23. The semiconductor device 100 is a Schottky barrier diode. It is noted that the metal layer 5 is not specifically illustrated in FIG. 1 (but see FIG. 6). FIG. 2 does not specifically illustrate the insulating layer 20 or the sub-regions of the semiconductor layer 10 and the first resin 21 is indicated by a broken line. In addition, in FIG. 2 the second resin 22 is shown only in part such that elements under the second resin 22 might be seen and described.

In descriptions of the embodiments, an XYZ orthogonal coordinate system is used. Furthermore, for convenience of description, the direction going from the lower electrode 1 towards the semiconductor layer 10 is referred to as "upper" or "upward" direction and the direction opposite is referred to as "lower" or "downward" direction. These directions are based on a relative position relationship between the lower electrode 1 and the semiconductor layer 10 and are not necessarily related to a direction of gravity.

As illustrated in FIG. 1, the semiconductor layer 10 is provided on the lower electrode 1. The semiconductor layer 10 includes a first region 10a and a second region 10b. The second region 10b is provided around the first region 10a in an X-Y plane (first plane). The first region 10a includes a central portion (center) of the semiconductor layer 10 in the X-Y plane. An area of the first region 10a in the X-Y plane is larger than an area of the second region 10b in the X-Y plane.

The semiconductor layer 10 includes an $n^+$ semiconductor region 11, an $n^-$ semiconductor region 12, a p semiconductor region 13, a p semiconductor region 14, and an n semiconductor region 15. The n+ semiconductor region 11 and the n− semiconductor region 12 are provided in the first region 10a and the second region 10b. The n+ semiconductor region 11 is electrically connected to the lower electrode 1. The n− semiconductor region 12 is located on the n+ semiconductor region 11. An n-type impurity concentration of the n− semiconductor region 12 is lower than an n-type impurity concentration of the n+ semiconductor region 11. The p semiconductor region 13 is provided selectively on the n− semiconductor region 12 in the second region 10b. A p-type impurity concentration of the p semiconductor region 13 is higher than the n-type impurity concentration of the n− semiconductor region 12.

The p semiconductor region 14 is provided surrounding a plurality of p semiconductor regions 13 along the X-Y plane and is located at a boundary between the first region 10a and the second region 10b. The p semiconductor region 14 may be spaced apart from the p semiconductor regions 13 or may contact one or more of the p semiconductor regions 13. A p-type impurity concentration of the p semiconductor region 14 gets lower outwardly along a generally radial direction from the center of the area surrounded by the p semiconductor region. For example, the p semiconductor region 14 includes an inner peripheral portion 14a, an intermediate portion 14b, and an outer peripheral portion 14c. The inner peripheral portion 14a is located in the first region 10a. The outer peripheral portion 14c is located in the second region 10b. The intermediate portion 14b is located between the inner peripheral portion 14a and the outer peripheral portion 14c in the generally radial direction. A p-type impurity concentration of the intermediate portion 14b is lower than a p-type impurity concentration of the inner peripheral portion 14a and higher than a p-type impurity concentration of the outer peripheral portion 14c.

The n semiconductor region 15 is provided surrounding the p semiconductor region 14 along the X-Y plane and is located near an outer periphery (outer edge) of an upper surface of the semiconductor layer 10. An n-type impurity concentration of the n semiconductor region 15 is higher than the n-type impurity concentration of the n− semiconductor region 12.

The upper electrode 2 is provided on the first region 10a. The upper electrode 2 includes a first part 2a and a second part 2b. The second part 2b is provided surrounding the first part 2a along the X-Y plane. A thickness of the second part 2b is less than a thickness of the first part 2a. In this context, "thickness" corresponds to a dimension along the Z direction.

A lower surface of the first part 2a and a lower surface of the second part 2b are located at the same height. In this context, "height" corresponds to a position along the Z direction from the lower electrode 1 or the like. An upper surface of the first part 2a and an upper surface of the second part 2b are located at different heights. The upper surface of the first part 2a is parallel with the upper surface of the second part 2b. A level difference (height change) is present between the upper surface of the first part 2a and the upper surface of the second part 2b.

Figure 6:
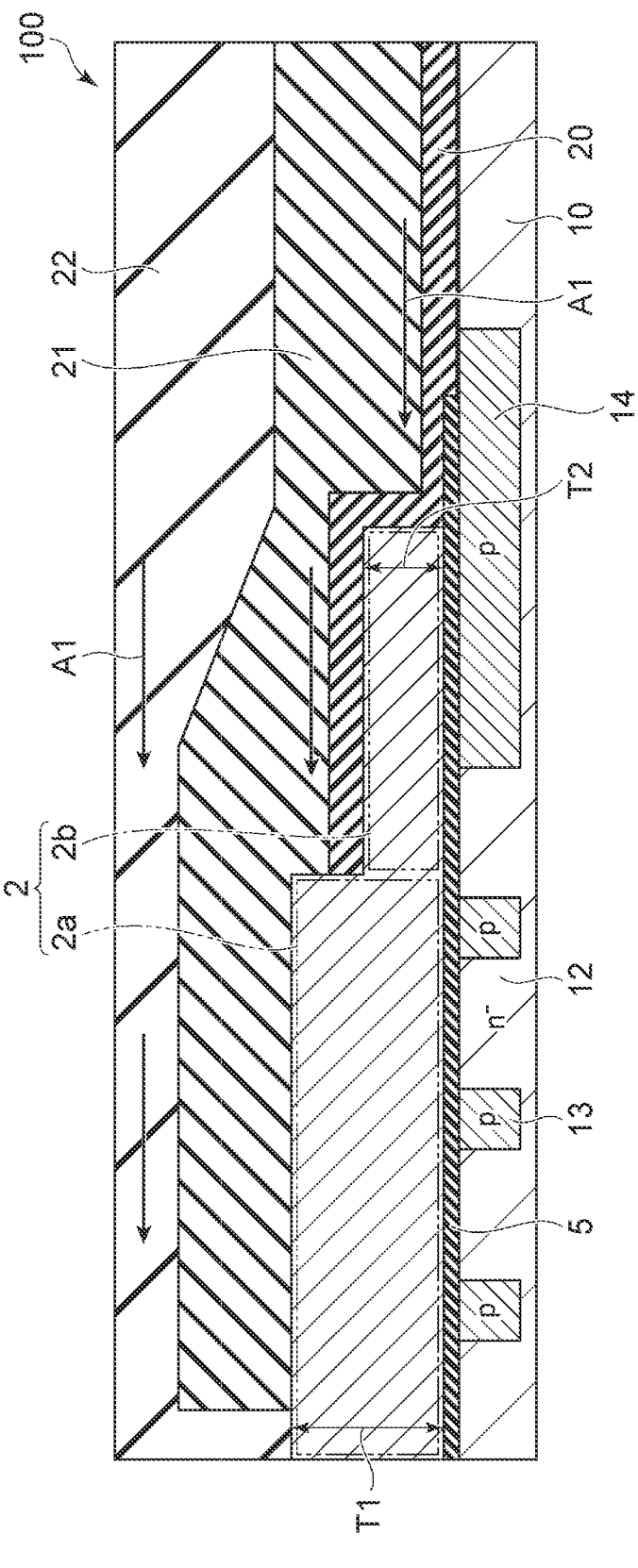
FIG. 6 is a cross-sectional view illustrating a part of a semiconductor device according to a first embodiment.

As illustrated in FIG. 6, the metal layer 5 is provided between the first region 10a and the first part 2a and also between the first region 10a and the second part 2b. A Schottky barrier is formed between the n− semiconductor region 12 and the metal layer 5. The p semiconductor regions 13 are in ohmic contact with the metal layer 5.

The upper surface of the semiconductor layer 10 and a lower surface of the upper electrode 2 are flat and parallel to the X-Y plane. The metal layer 5 is formed parallel with the X-Y plane.

The insulating layer 20 is provided on the second region 10b. A part of the insulating layer 20 may cover an outer periphery of the upper electrode 2. The first resin 21 has insulating properties. The first resin 21 is provided on the insulating layer 20 and located on the second region 10b. The first resin 21 also covers a part of the upper electrode 2. Specifically, the first resin 21 covers the entire second part 2b and an outer periphery portion of the first part 2a.

The interconnection 23 is conductive and provided on the first part 2a. The interconnection 23 is electrically connected to the upper electrode 2. The interconnection 23 is used to electrically connect the semiconductor device 100 to an external electronic device. The interconnection 23 may be an external lead, bonding wire connection, soldered connection or the like.

The second resin 22 has insulating properties and is provided on the upper electrode 2, the first resin 21, and the interconnection 23. For example, the second resin 22 is surrounds and encapsulates the lower electrode 1, the upper electrode 2, the semiconductor layer 10, the first resin 21, the second resin 22, and a part of the interconnection 23.

As illustrated in FIG. 2, the second part 2b is provided over the entire outer periphery of the upper electrode 2. The first resin 21 is provided over an entire outer periphery (e.g., the entire second region 10b) of the semiconductor layer 10 and covers the entire second part 2b.

When a positive voltage is applied to the upper electrode 2 with respect to the lower electrode 1, a current is carried from the upper electrode 2 to the lower electrode 1 through the semiconductor layer 10. When a positive voltage is applied to the lower electrode 1 with respect to the upper electrode 2, no current is carried to the semiconductor layer 10. A depletion layer spreads from an interface between the n− semiconductor region 12 and the upper electrode 2 and an interface between the n− semiconductor region 12 and the p semiconductor region 13 to the n− semiconductor region 12.

An example of a material for each element will be described.

The lower electrode 1 comprises a metal such as copper, aluminum, nickel, titanium, or gold. The upper electrode 2 comprises copper or aluminum. In the upper electrode 2, both the first part 2a and the second part 2b can be copper or aluminum. The metal layer 5 comprises a metal material that can form a Schottky barrier with the semiconductor layer 10. The metal layer 5 is, for example, titanium, platinum, molybdenum, or vanadium. The semiconductor layer 10 comprises a semiconductor material such as single-crystal silicon, silicon carbide, gallium nitride, or gallium arsenide. The insulating layer 20 comprises an insulating material such as silicon oxide or silicon nitride. The interconnection 23 comprises a metal material such as aluminum and can be formed by wire bonding or the like.

The first resin 21 can be an insulating resin material such as polyimide. The second resin 22 can be a resin material different from the first resin 21. The second resin 22 is, for example, an insulating resin material such as epoxy resin or silicone gel. The first resin 21 can have better electrical insulating properties than the second resin 22. The first resin 21 can be used for reducing surface creepage at a surface of the second region 10b and reducing ion movement (migration) to an upper surface of the second region 10b. The second resin 22 forms an outer surface of the semiconductor device 100. The second resin 22 preferably has thermoplasticity so that a shape of the second resin 22 can be worked more easily than the first resin 21. That is, the second resin is preferably a thermoplastic type resin material.

Advantages of the first embodiment will be described.

FIGS. 3A, 3B, 4A, 4B, and 5 are cross-sectional views illustrating a part of a semiconductor device of a reference example.

In a semiconductor device 100r according to the reference example as illustrated in FIG. 3A, the upper electrode 2 includes only the first part 2a and does not include the second part 2b. The upper electrode 2 has a constant thickness.

When a current is carried to the semiconductor layer 10, heat is generated in the semiconductor layer 10. This results in an increase in temperatures of the semiconductor layer 10, the first resin 21, the second resin 22, and the like. Amounts of thermal expansion of the first resin 21 and the second resin 22 are larger than an amount of thermal expansion of the semiconductor layer 10. Particularly when the second resin 22 has thermoplasticity, the second resin 22 thermally expands more at a temperature exceeding a glass transition point. The glass transition point of an epoxy resin is, for example, approximately 150 to 170° C.

During temperature increases in the first resin 21 and the second resin 22, the first resin 21 and the second resin 22 both thermally expand. The amount of thermal expansion of the second resin 22 is larger than the amount of thermal expansion of the first resin 21. When the thermally expanding resins are cooled, the first resin 21 and the second resin 22 will shrink in a direction of the arrows A1 illustrated in FIG. 3A. The amount of thermal shrinkage of the second resin 22 is larger than the amount of thermal shrinkage of the first resin 21. A force in the direction of the arrows A1 will be exerted on the first resin 21 from the second resin 22 and the force applied to the first resin 21 will be transmitted to the upper electrode 2.

The upper electrode 2 comprises copper or aluminum. Copper and aluminum each have high thermal conductivity and low electrical resistivity and are thus preferable as electrode materials. On the other hand, copper and aluminum are relatively soft metals. Owing to this, when the force is exerted on the upper electrode 2 from the first resin 21, a high stress is applied to a side surface of the upper electrode 2 and an outer periphery of the upper electrode 2 deforms, as illustrated in FIG. 3B.

Subsequently, when the temperatures of the first resin 21 and the second resin 22 increase again, the first resin 21 and the second resin 22 expand in the direction of arrows A2 illustrated in FIG. 4A. The amount of thermal expansion of the second resin 22 is larger than the amount of thermal expansion of the first resin 21. A force in the direction of the arrow A2 is exerted on the upper electrode 2 and the first resin 21 from the second resin 22. A high stress is applied to the outer periphery of the upper electrode 2 from a center of the upper electrode 2, potentially increasing a thickness at the outer periphery of the upper electrode 2.

Figure 4A:
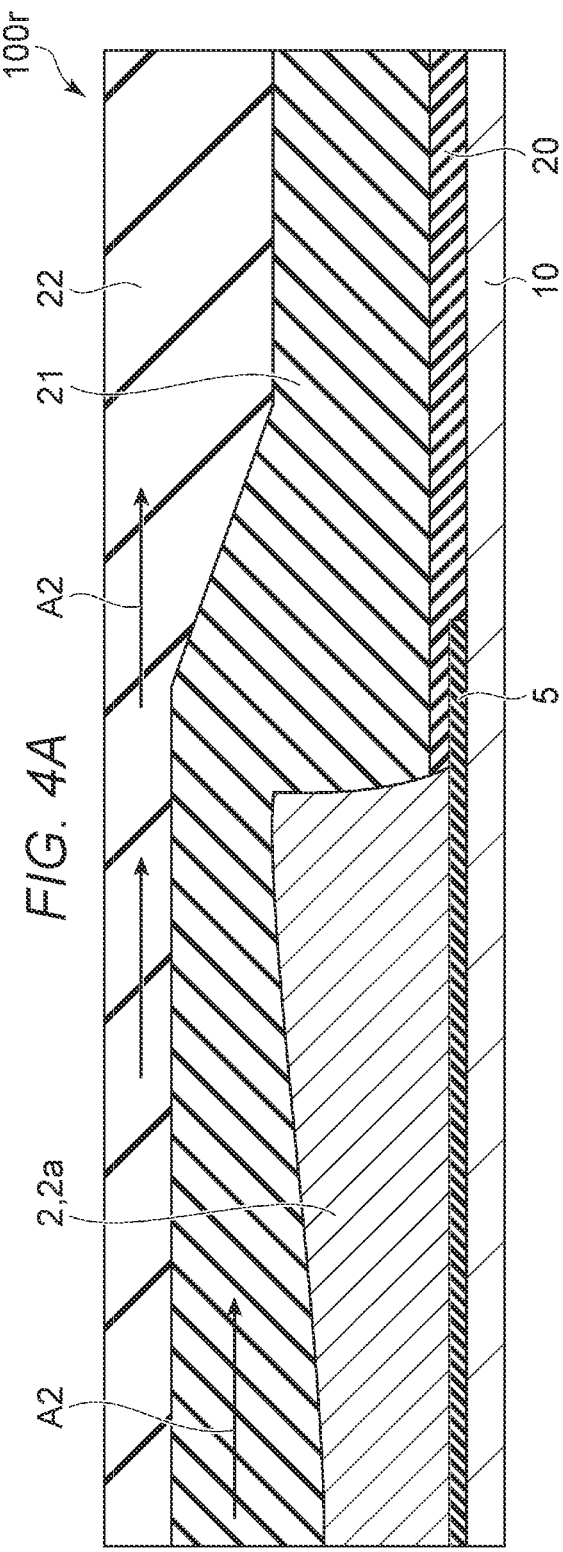
FIGS. 4A and 4B are cross-sectional views illustrating a part of the semiconductor device of the reference example.
Figure 4B:
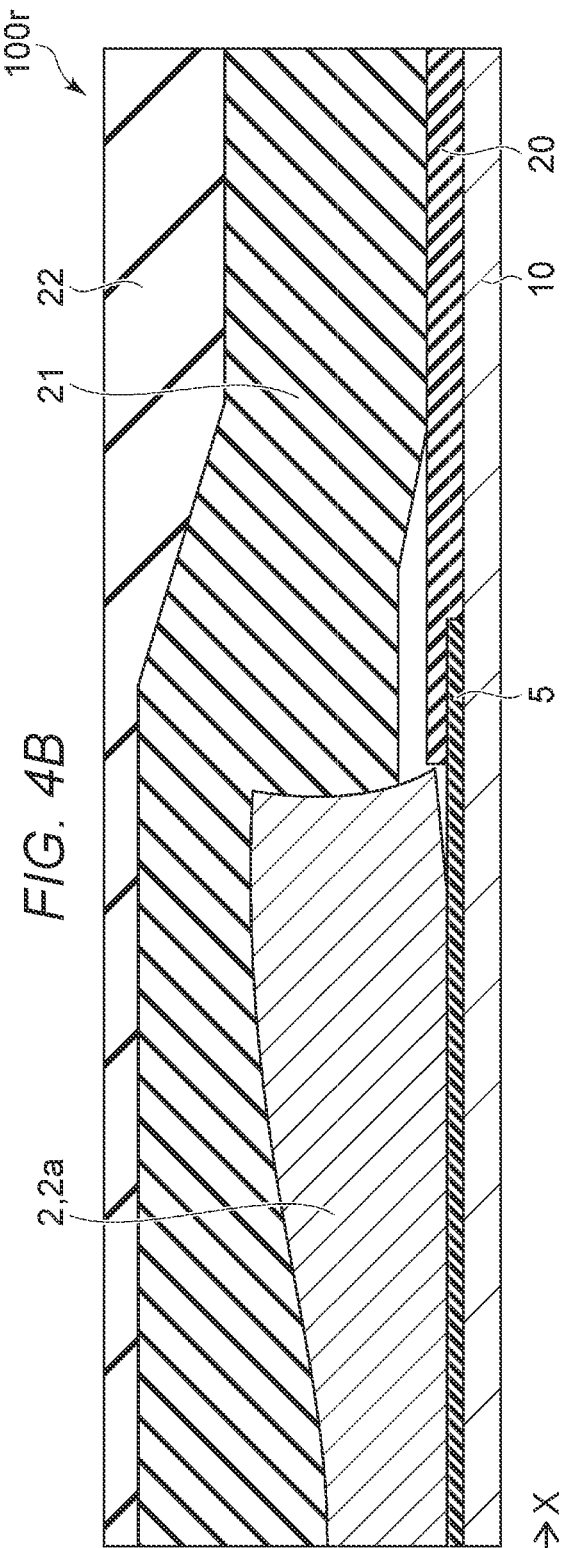

When a temperature cycle (temperature changes up and down) is repeated, the phenomena illustrated in FIGS. 3B and 4A repeatedly take place. When the thickness of the outer periphery of the upper electrode 2 is made larger, the stress applied from the first resin 21 to the upper electrode 2 increases during the cooling. As a result of the repetition of the increase of the thickness and the increase of the stress, the outer periphery of the upper electrode 2 may eventually peel off from the metal layer 5, as illustrated in FIG. 4B.

Furthermore, the first resin 21 may similarly peel off from the insulating layer 20 when following the peel-off of the upper electrode 2.

Figure 5:
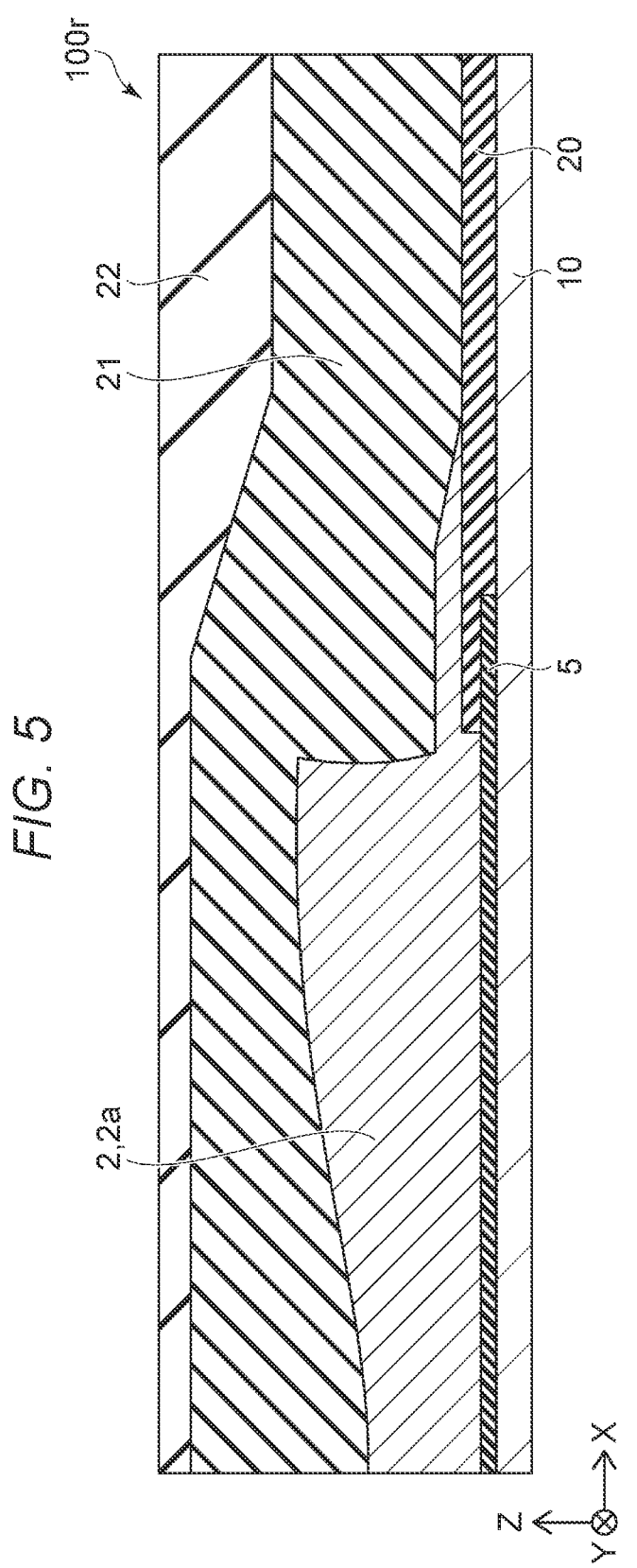
FIG. 5 is a cross-sectional view illustrating a part of the semiconductor device of the reference example.

In the subsequent temperature cycles, the stress is applied to the outer periphery of the upper electrode 2 from the center of the upper electrode 2 during the thermal expansion of the first resin 21 and the second resin 22, as illustrated in FIG. 4A. At this time, a part of the upper electrode 2 may enter into the gap left between the insulating layer 20 and the first resin 21, as illustrated in FIG. 5. A overall size of the upper electrode 2 in the X-Y plane increases, changing characteristics of the semiconductor device 100. For example, the spread of the depletion layer in the second region 10b changes and a withstand voltage of the semiconductor device 100 changes.

A method of reducing the thickness of the upper electrode 2 may be considered to reduce the deformation of the upper electrode 2 that can be caused by the temperature cycles. With such a method, it is possible to reduce the area of the side surfaces of the upper electrode 2 to which the stress is applied from the first resin 21 during the thermal shrinkage of the first resin 21 and the second resin 22. Thus, the stress applied from the first resin 21 to the upper electrode 2 can be reduced. However, when the thickness of the upper electrode 2 is made small, the electrical resistance of the upper electrode 2 increases in the X direction or the Y direction. The increase in the electrical resistance of the semiconductor device 100 causes increases in heat generation and power consumption of the semiconductor device 100.

FIG. 6 is a cross-sectional view illustrating a part of the semiconductor device according to the first embodiment.

In the semiconductor device 100 according to the first embodiment, the upper electrode 2 includes the second part 2b. The second part 2b is provided surrounding the first part 2a. In addition, the thickness of the second part 2b is less than the thickness of the first part 2a. During the thermal shrinkage of the first resin 21 and the second resin 22, the stress applied from the first resin 21 to the upper electrode 2 in the direction of the arrows A1 can be dispersed to side surfaces of the first part 2a and side surfaces of the second part 2b. This can reduce the stress applied to any one surface and act to mitigate the stress applied from the first resin 21 to the upper electrode 2. This can also reduce the peel-off of the upper electrode 2, the change in the size of the upper electrode 2, and the like and, therefore, reduce degradation in the characteristics of the semiconductor device 100. As a result, reliability of the semiconductor device 100 can be improved.

Furthermore, in the semiconductor device 100, the upper electrode 2 includes the first part 2a thicker than the second part 2b. The upper electrode 2 includes the first part 2a, so that it is possible to avoid the issues related to an increase in the electrical resistance of the upper electrode 2 in the X direction or the Y direction associated with thinner electrodes. According to the first embodiment, it is possible to reduce the degradation in the characteristics of the semiconductor device 100 while avoiding an increase in the electrical resistance of the semiconductor device 100.

When the second part 2b is made too thick, it is difficult to disperse the stress applied from the first resin 21 to the upper electrode 2. When the second part 2b is made too thin, the electrical resistance of the second part 2b may excessively increase. Preferably, therefore, a thickness T2 of the second part 2b is between than 0.4 and 0.7 times the thickness T1 of the first part 2a. The thickness T2 can be substantially larger than the thickness of the metal layer 5.

For example, the second part 2b can be formed by first forming an upper electrode 2 having a uniform thickness and then etching only the outer periphery of the initially uniformly thick upper electrode 2.

The first embodiment is particularly suited for a case where the semiconductor layer 10 comprises silicon carbide. The semiconductor device 100 (a SiC device) in which the semiconductor layer 10 is silicon carbide is typically required to have a higher temperature of operation guarantee than the semiconductor device 100 (a silicon device) in which the semiconductor layer 10 is silicon. Owing to this, when the semiconductor layer 10 contains silicon carbide, a temperature of the semiconductor device 100 could be expected to be higher than that when the semiconductor layer 10 contains silicon. In addition, when the semiconductor layer 10 contains silicon carbide, the coefficient of thermal expansion of the semiconductor layer 10 is smaller than that of the semiconductor layer 10 containing silicon. The difference in the amount of thermal expansion between the semiconductor layer 10 and the upper electrode 2 is greater than that in a case where the semiconductor layer 10 contains silicon. As a result, the peel-off of the upper electrode 2, the peel-off of the first resin 21, and the like tend to occur more often. According to the first embodiment, even when the semiconductor device 100 contains silicon carbide, it is still possible to effectively reduce the peel-off of the upper electrode 2 and reduce the degradation in the characteristics of the semiconductor device 100.

Figure 7:
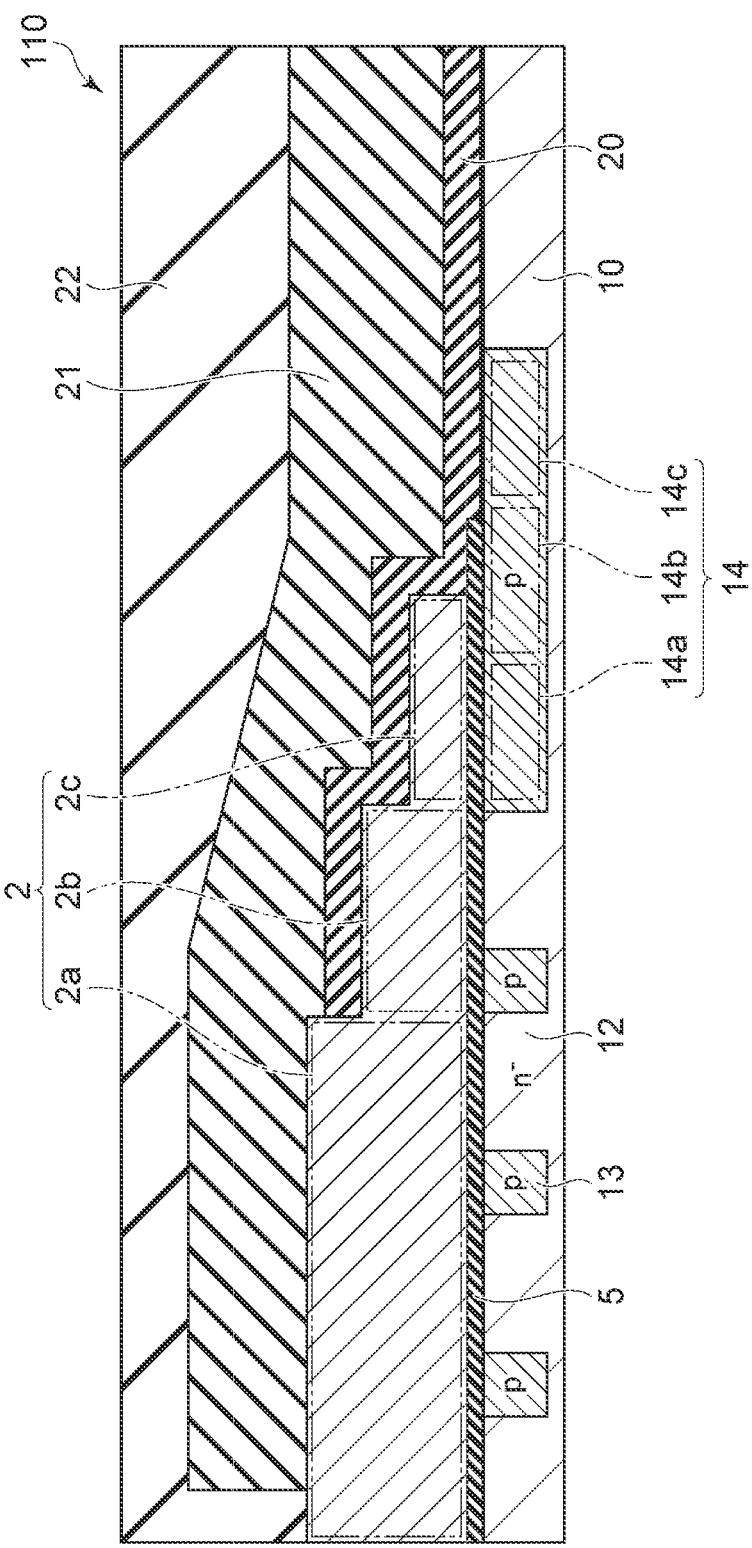
FIG. 7 is a cross-sectional view illustrating a part of a semiconductor device according to a modification of a first embodiment.
Figure 8:
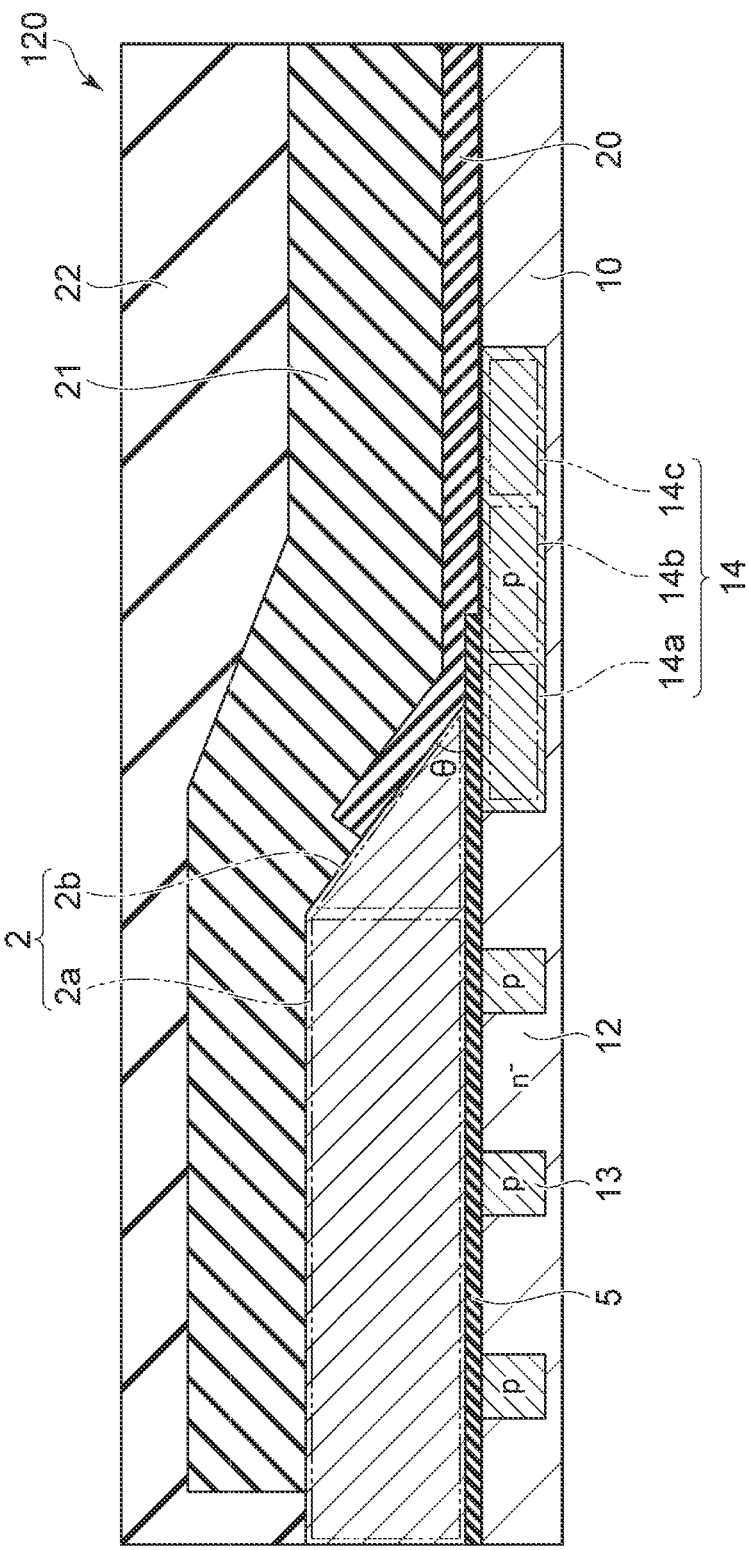
FIG. 8 is a cross-sectional view illustrating a part of a semiconductor device according to a modification of a first embodiment.
Figure 9:
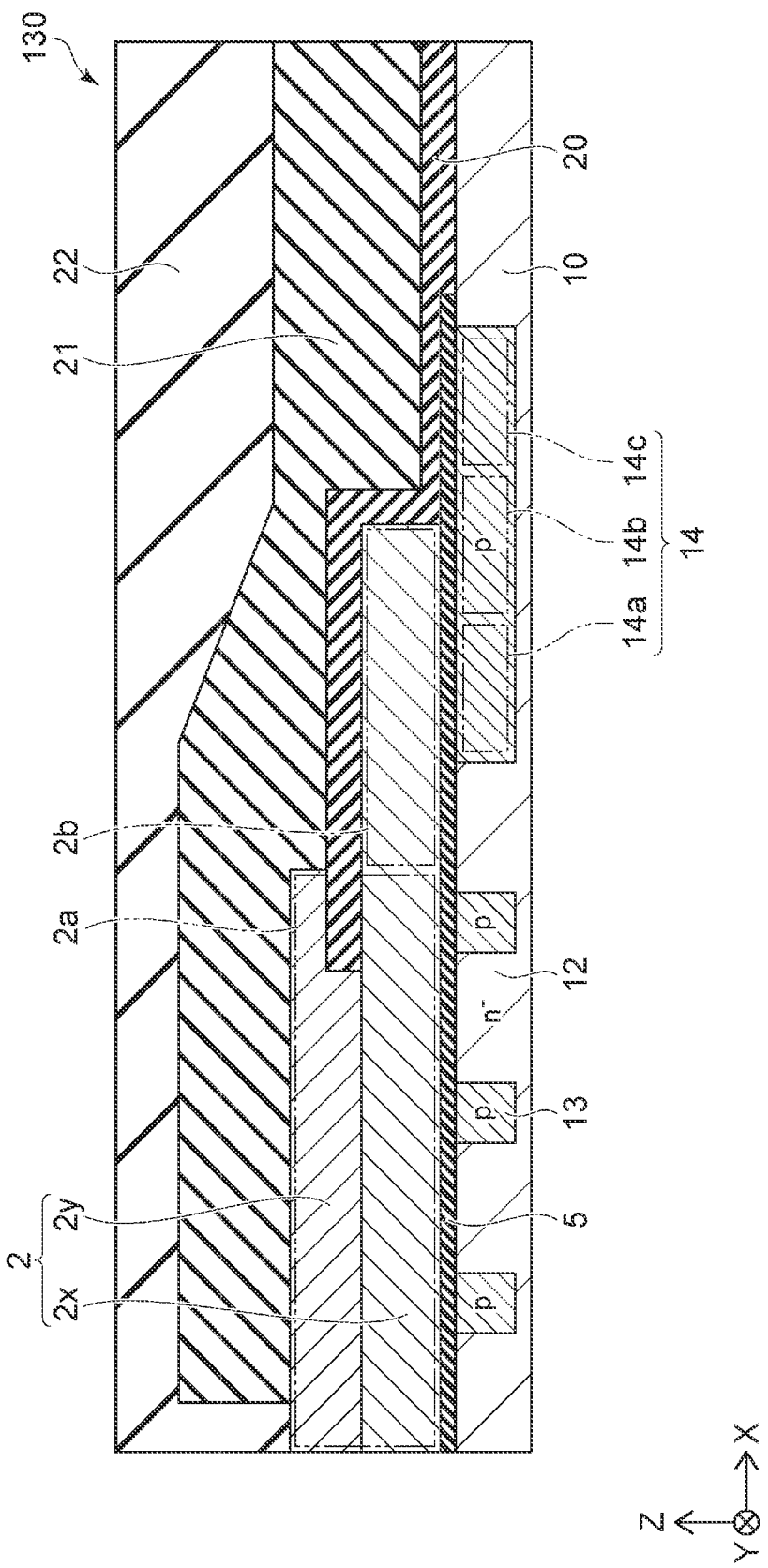
FIG. 9 is a cross-sectional view illustrating a part of a semiconductor device according to a modification of a first embodiment.

FIGS. 7 to 9 are cross-sectional views illustrating a part of semiconductor devices according to different modifications of the first embodiment.

In a semiconductor device 110 illustrated in FIG. 7, the upper electrode 2 further includes a third part 2c. The third part 2c is provided surrounding the second part 2b in the X-Y plane. A thickness of the third part 2c is less than the thickness of the second part 2b. Providing the third part 2c makes it possible to further disperse the stress applied from the first resin 21 to the upper electrode 2.

In a semiconductor device 120 illustrated in FIG. 8, the upper surface of the second part 2b is inclined with respect to the X-Y plane. The thickness of the second part 2b becomes continuously less along an outward radial direction. For example, an angle θ of the upper surface of the second part 2b with respect to the X-Y plane is between zero degrees and 90 degrees. More preferably, the angle θ is between 60 degrees and 80 degrees from the viewpoint of reducing an increase in the electrical resistance and avoiding a degradation in device characteristics.

When the upper surface of the second part 2b is inclined with respect to the X-Y plane, the first resin 21 may move along the upper surface of the second part 2b during the thermal shrinkage of the first resin 21 and the second resin 22. This makes it difficult to apply the stress to the upper electrode 2 from the first resin 21. A structure of the semiconductor device 120 enables an effective mitigation of the stress applied from the first resin 21 to the upper electrode 2.

In a semiconductor device 130 illustrated in FIG. 9, the upper electrode 2 has a stacked structure including metal layers 2x and 2y. The metal layer 2y is provided on the metal layer 2x. A size of the metal layer 2y in the X-Y plane is less than a size of the metal layer 2x in the X-Y plane. A part of the metal layer 2x and the metal layer 2y collectively correspond to the first part 2a. A remainder of the metal layer 2x outside the first part 2a corresponds to the second part 2b.

The metal layers 2x and 2y comprise copper or aluminum. The metal of the metal layer 2x may differ from the metal of the metal layer 2y. As illustrated in FIG. 9, a part of the insulating layer 20 may be provided between an outer periphery of the metal layer 2x and an outer periphery of the metal layer 2y. When including a third part 2c or the like, as illustrated in FIG. 7, the upper electrode 2 may contain more than just two metal layers.

According to the modifications illustrated in FIGS. 7 to 9, like the semiconductor device 100, it is possible to mitigate the stress from the first resin 21 to the upper electrode 2 and reduce the degradation in characteristics of the semiconductor devices 110 to 130. Furthermore, it is possible to reduce the increase in the electrical resistance of the upper electrode 2 since the thickness of the first part 2a is kept larger than the thickness of the second part 2b.

Second Embodiment

Figure 10:
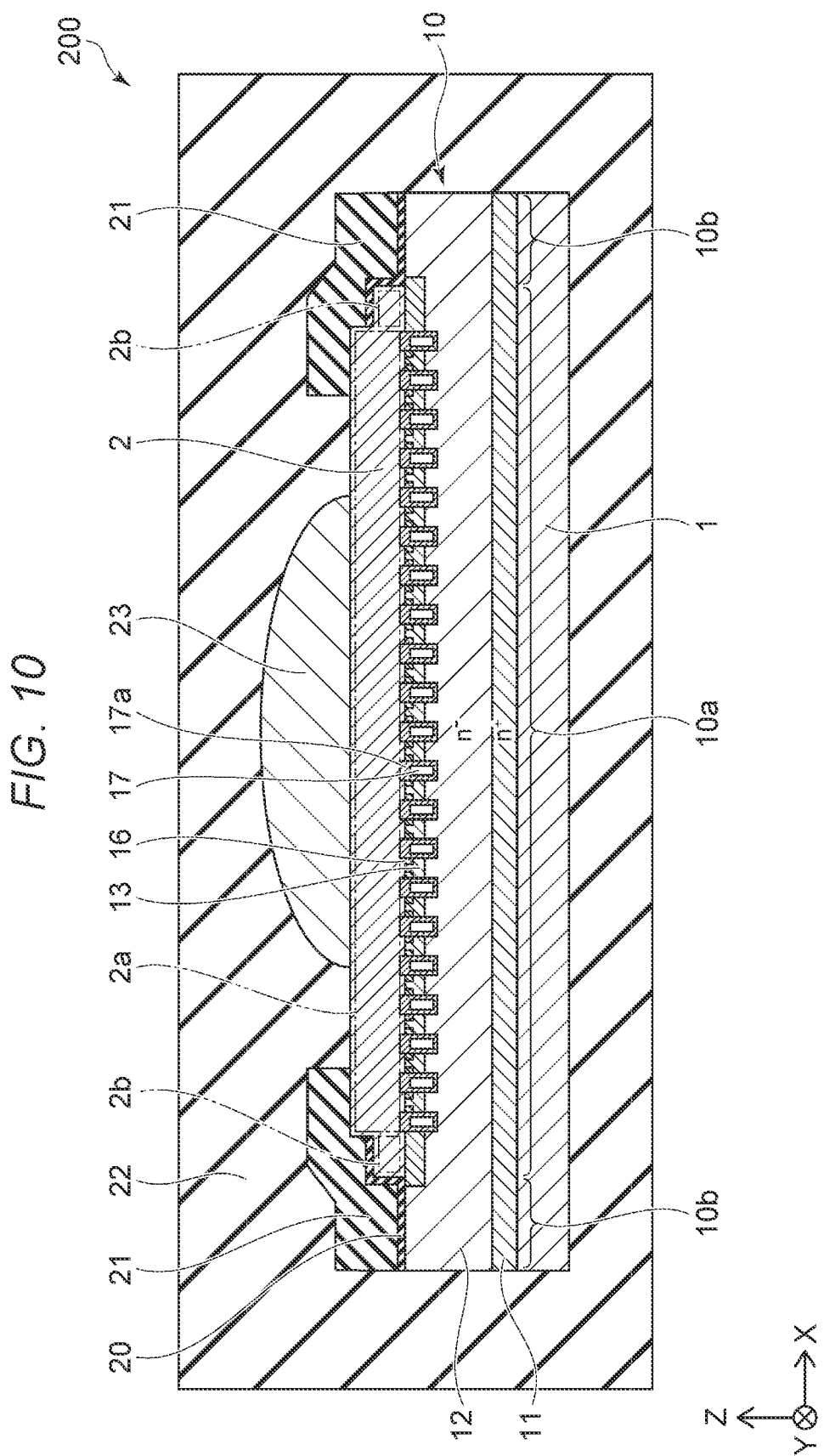
FIG. 10 is a cross-sectional view illustrating a semiconductor device according to a second embodiment.

FIG. 10 is a cross-sectional view illustrating a semiconductor device according to a second embodiment.

As illustrated in FIG. 10, in a semiconductor device 200 according to the second embodiment, the semiconductor layer 10 further includes an $n^+$ semiconductor region 16 and a gate electrode 17 when compared with the semiconductor device 100. The semiconductor device 200 does not include the metal layer 5. The semiconductor device 200 is a MOSFET.

The gate electrode 17 is provided in the second region 10b. The gate electrode 17 faces the p semiconductor region 13 via a gate insulating layer 17a in the X direction. The $n^+$ semiconductor region 16 is selectively provided on the p semiconductor region 13. The p semiconductor regions 13 and the $n^+$ semiconductor region 16 are electrically connected to the upper electrode 2.

The p semiconductor region 13, the $n^+$ semiconductor region 16, and the gate electrode 17 extend in the Y direction. A plurality of p semiconductor regions 13, a plurality of $n^+$ semiconductor regions 16, and a plurality of gate electrodes 17 are provided in the X direction.

If a positive voltage is applied to the upper electrode 2 with respect to the lower electrode 1, and a voltage equal to or higher than a threshold voltage is applied to the gate electrodes 17, a channel (inversion layer) is formed in each p semiconductor region 13, turning on the semiconductor device 200 and electrons flow from the upper electrode 2 to the lower electrode 1 through the channels thus formed. When the voltage applied to the gate electrodes 17 is lower than the threshold voltage, the channels are eliminated in the p semiconductor regions 13, turning off the semiconductor device 200.

In the semiconductor device 200, like the semiconductor device 100, the p semiconductor region 14 and the n semiconductor region 15 may be provided. In that case, the p semiconductor region 14 is provided surrounding the p semiconductor regions 13 along the X-Y plane. The n semiconductor region 15 is provided surrounding the p semiconductor region 14 along the X-Y plane and is located near the outer periphery edge of the upper surface of the semiconductor layer 10.

In the semiconductor device 200, like the semiconductor devices 100 to 130, the upper electrode 2 includes the first part 2a and the second part 2b. Owing to this, according to the second embodiment, like the first embodiment, it is possible to reduce the degradation in characteristics of the semiconductor device 200 while avoiding an increase in an electrical resistance of the semiconductor device 200.

In the semiconductor device 200, upper surfaces of the semiconductor regions such as the p semiconductor regions 13 and the n⁺ semiconductor regions 16 differ in height from upper surfaces of the gate insulating layers 17a. This may result in the presence of irregularities in the upper surface of the semiconductor layer 10 and the lower surface of the upper electrode 2. Therefore, during the shrinkage of the first resin 21 and the second resin 22, the stress is dispersed to the plurality of gate insulating layers 17a when the stress is applied from the first resin 21 to the upper electrode 2. As a result, it is possible to limit the increase in the thickness of the outer periphery of the upper electrode 2 and also limit the increase in the stress applied from the first resin 21 to the outer periphery of the upper electrode 2.

In the semiconductor devices 100 to 130 according to the first embodiment, the upper surface of the semiconductor layer 10 and the lower surface of the upper electrode 2 are generally flat. Thus, the increase in the thickness of the outer periphery of the upper electrode 2, tends to occur more than as compared with the semiconductor device 200 according to the second embodiment. Nevertheless, according to the first embodiment, it is possible to effectively avoid the peel-off of the upper electrode 2 even if the peel-off of the upper electrode 2 would otherwise tend to occur more frequently.

Relative impurity concentrations in the semiconductor regions of each of the embodiments can be checked using, for example, a scanning capacitance microscope (SCM). It is noted that the carrier concentration in each semiconductor region can be considered to be equal to the impurity concentration activated in each semiconductor region. Therefore, relative highs and lows of the carrier concentrations in the semiconductor regions can be similarly checked using the SCM. The impurity concentration in each semiconductor region can also be measured by, for example, secondary ion mass spectrometry (SIMS).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
    a first electrode;
    a semiconductor layer above the first electrode in a first direction and including a first region and a second region surrounding the first region in a first plane perpendicular to the first direction;
    a second electrode having a first portion and a second portion that is thinner than the first portion in the first direction and surrounding the first portion in a plane parallel to the first plane, the first portion and the second portion being above the first region of the semiconductor layer in the first direction;
    an insulating first resin on the second region and covering an outer periphery of the first portion and the second portion; and
    an insulating second resin on the second electrode and the insulating first resin, the insulating second resin comprising a resin material different from the insulating first resin.

2. The semiconductor device according to claim 1, wherein an upper surface of the second portion is parallel to the first plane.

3. The semiconductor device according to claim 2, wherein the insulating second resin surrounds the first electrode, the semiconductor layer, the second electrode, and the insulating first resin.

4. The semiconductor device according to claim 1, wherein an upper surface of the second portion is inclined with respect to the first plane.

5. The semiconductor device according to claim 4, wherein the insulating second resin surrounds the first electrode, the semiconductor layer, the second electrode, and the insulating first resin.

6. The semiconductor device according to claim 1, wherein the insulating second resin surrounds the first electrode, the semiconductor layer, the second electrode, and the insulating first resin.

7. The semiconductor device according to claim 1, wherein an upper surface of the semiconductor layer and a lower surface of the second electrode are parallel to the first plane.

8. The semiconductor device according to claim 1, wherein the insulating second resin is a thermoplastic material.

9. The semiconductor device according to claim 1, wherein the semiconductor layer comprises silicon carbide.

10. The semiconductor device according to claim 1, further comprising:
    an interconnection contacting an upper surface of the first portion of the second electrode.

11. The semiconductor device according to claim 1, further comprising:
    a metal layer between the first region of the semiconductor layer and the first and second portions of the second electrode in the first direction.

12. The semiconductor device according to claim 1, wherein
    the second electrode comprises a first metal layer and a second metal layer above the first metal layer,
    the second metal layer is part of the first portion of the second electrode, and
    the first metal layer is part of the first and second portions of the second electrode.

13. The semiconductor device according to claim 1, wherein the second electrode further includes a third portion surrounding the second portion in the plane parallel to the first plane, the third portion being thinner in the first direction than the second portion.

14. The semiconductor device according to claim 1, wherein the insulating first resin is a polyimide.

15. The semiconductor device according to claim 1, wherein the insulating second resin is an epoxy resin.

16. The semiconductor device according to claim 1, further comprising:
    a gate electrode surrounded by a gate insulating film, the gate electrode being in the semiconductor layer between the first and second electrodes in the first direction.

17. The semiconductor device according to claim 1, wherein first and second portions of the second electrode comprise copper or aluminum.

18. A semiconductor device, comprising:
    a first electrode;
    a semiconductor layer above the first electrode in a first direction and including a first region and a second region surrounding the first region in a first plane perpendicular to the first direction;

a second electrode having a first portion and a second portion that is thinner than the first portion in the first direction and surrounding the first portion in a plane parallel to the first plane, the first portion and the second portion comprising copper or aluminum and being above the first region of the semiconductor layer in the first direction;

a polyimide on the second region and covering an outer periphery of the first portion and the second portion; and an epoxy resin on the second electrode and the polyimide.

19. The semiconductor device according to claim 18, further comprising:

an interconnection in the epoxy resin and contacting an upper surface of the first portion of the second electrode.

\* \* \* \* \*